United States Patent
Taylor et al.

(10) Patent No.: US 9,857,437 B2
(45) Date of Patent: Jan. 2, 2018

(54) HALL EFFECT SENSING ELEMENT

(71) Applicant: Allegro Microsystems, LLC, Worcester, MA (US)

(72) Inventors: William P. Taylor, Amherst, NH (US); Harianto Wong, Southborough, MA (US)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

(21) Appl. No.: 15/088,493

(22) Filed: Apr. 1, 2016

(65) Prior Publication Data

US 2016/0299200 A1 Oct. 13, 2016

Related U.S. Application Data

(60) Provisional application No. 62/145,806, filed on Apr. 10, 2015.

(51) Int. Cl.
*H01L 43/04* (2006.01)
*H01L 43/06* (2006.01)
(Continued)

(52) U.S. Cl.
CPC ......... *G01R 33/07* (2013.01); *G01R 33/0052* (2013.01); *H01L 23/481* (2013.01);
(Continued)

(58) Field of Classification Search
CPC ....... H01L 43/04; H01L 43/06; H01L 43/065; H01L 43/10; H01L 43/14
See application file for complete search history.

(56) References Cited

U.S. PATENT DOCUMENTS 7,768,083 B2   8/2010   Doogue et al.
8,357,983 B1   1/2013   Wang
(Continued)

FOREIGN PATENT DOCUMENTS

TW   M399990 U1    3/2011
TW   201243356 A1  11/2012
TW   201323907 A1  6/2013

OTHER PUBLICATIONS

Tabuchi et al., "Control of Carrier Concentration in Thin Cuprous Oxide $Cu_2O$ Films by Atomic Hydrogen;" Proceedings of the Japanese Journal of Applied Physics, vol. 41, Part 1, No. 8; Aug. 2002; pp. 5060-5063; 4 Pages.
(Continued)

*Primary Examiner* — Daniel Shook
(74) *Attorney, Agent, or Firm* — Daly, Crowley, Mofford & Durkee, LLP

(57) ABSTRACT

In one aspect, a Hall Effect sensing element includes a Hall plate having a thickness less than about 100 nanometers an adhesion layer directly in contact with the Hall plate and having a thickness in a range about 0.1 nanometers to 5 nanometers. In another aspect, a sensor includes a Hall Effect sensing element. The Hall Effect sensing element includes a substrate that includes one of a semiconductor material or an insulator material, an insulation layer in direct contact with the substrate, an adhesion layer having a thickness in a range of about 0.1 nanometers to 5 nanometers and in direct contact with the insulation layer and a Hall plate in direct contact with the adhesion layer and having a thickness less than about 100 nanometers.

33 Claims, 6 Drawing Sheets

(51) Int. Cl.
    *H01L 43/14* (2006.01)
    *G01R 33/07* (2006.01)
    *H01L 43/10* (2006.01)
    *G01R 33/00* (2006.01)
    *H01L 23/48* (2006.01)
    *H01L 27/22* (2006.01)
(52) U.S. Cl.
    CPC ............ *H01L 27/22* (2013.01); *H01L 43/04* (2013.01); *H01L 43/06* (2013.01); *H01L 43/065* (2013.01); *H01L 43/10* (2013.01); *H01L 43/14* (2013.01); *H01L 2224/4826* (2013.01); *H01L 2224/48091* (2013.01)

(56) References Cited

U.S. PATENT DOCUMENTS

| | | | |
|---|---|---|---|
| 2008/0151615 A1* | 6/2008 | Rodmacq | B82Y 25/00 365/173 |
| 2011/0204460 A1* | 8/2011 | Wong | H01L 43/065 257/427 |

OTHER PUBLICATIONS

PCT International Search Report and Written Opinion dated Jun. 22, 2016 corresponding to International Application No. PCT/US2016/025547; 19 Pages.

Choi et al., "Tunable Electrical Properties of TaN$_x$ Thin Films Grown by Ionized Physical Vapor Deposition;" Journal of Vacuum Science and Technology B: Microelectronics and Nanometer Structures, vol. 32, No. 5; Jul. 25, 2014; 4 Pages.

Do et al., "Structure and Property of Epitaxial Titanium Oxynitride Grown on MgO(001) Substrate by Pulsed Laser Deposition;" Surface and Coatings Technology, vol. 214; Jan. 2013; pp. 91-96; 6 Pages.

Lee et al., "Hall Mobility of Cuprous Oxide Thin Films Deposited by Reactive Direct-Current Magnetron Sputtering;" Applied Physics Letters, vol. 98, No. 19; May 13, 2011; 3 Pages.

Steeves, "Electronic Transport Properties of Ruthenium and Ruthenium Dioxide Thin Films;" Electronic Theses and Dissertations; Jan. 2011; 187 Pages.

Taiwan Office Action with translation dated Oct. 27, 2017 for Taiwan Patent Application No. 105110911; 13 pages.

* cited by examiner

HALL EFFECT SENSING ELEMENT

RELATED APPLICATIONS

This application claims the benefit of U.S. Provisional Application No. 62/145,806 filed Apr. 10, 2015, and entitled "HALL EFFECT SENSING ELEMENT," which is incorporated herein by reference in its entirety.

BACKGROUND

Hall Effect magnetic field sensing elements are known. As is known, a Hall Effect element includes a so-called "Hall plate," which is most often an epitaxial region (i.e., a layer) upon a substrate. The epitaxial region is understood to have a medium amount of doping.

SUMMARY

In one aspect, a Hall Effect sensing element includes a Hall plate having a thickness less than about 100 nanometers and an adhesion layer directly in contact with the Hall plate and having a thickness in a range about 0.1 nanometers to 5 nanometers. This aspect may include one or more of the following features. The thickness of the Hall plate may be less than about 10 nm. The Hall plate may have a carrier concentration in a range of about $10^{19}$ to about $10^{26}$. The Hall plate may have a carrier concentration is in a range of about $10^{22}$ to $10^{24}$. The Hall plate may include a metal nitride material. The metal nitride material may include at least one of tantalum nitride or titanium oxide nitride. The Hall plate may include a metal oxide material. The metal oxide material may include a copper oxide. The copper oxide may be cuprous oxide. The adhesion layer may include ruthenium or ruthenium oxide. The Hall Effect sensing element may include a substrate comprising one of a semiconductor material or an insulator material and the adhesion layer disposed between the plate material and the substrate material. The Hall Effect sensing element may include an integrated circuit on the semiconductor substrate material. The Hall Effect sensing element may include vias connecting the Hall effect sensing element to the integrated circuit from the bottom or substrate side of the Hall effect sensing element. The Hall Effect sensing element may include vias connecting the Hall effect sensing element to the integrated circuit from the top or furthest side of the Hall effect sensing element away from the substrate or integrated circuit. The semiconductor material may include silicon. The insulator material may include at least one of glass or a ceramic material. The insulator material may include alumina. The insulator material may include an oxide or nitride. The Hall Effect sensing element may include a passivation layer directly in contact with the Hall plate. The passivation layer may be at least one of a nitride, an oxide, a polymer, a polyimide, or benzocyclobutene (BCB).

In another aspect, a sensor includes a Hall Effect sensing element. The Hall Effect sensing element includes a substrate comprising one of a semiconductor material or an insulator material, an insulation layer in direct contact with the substrate, an adhesion layer having a thickness in a range of about 0.1 nanometers to 5 nanometers and in direct contact with the insulation layer and a Hall plate in direct contact with the adhesion layer and having a thickness less than about 100 nanometers. This aspect may include one or more of the following features. The adhesion layer may include ruthenium or ruthenium oxide and the Hall plate may include copper oxide. The thickness of the Hall plate may be less than about 10 nm. The Hall plate may have a carrier concentration is in a range of about $10^{22}$ to $10^{24}$. The Hall plate may include a metal nitride material. The metal nitride may include at least one of tantalum nitride or titanium oxide nitride. The Hall plate material may be a metal oxide material. The metal oxide may include a copper oxide or ruthenium oxide. The copper oxide may be cuprous oxide. The adhesion layer may include one of titanium, tantalum or ruthenium. The semiconductor material may include silicon. The insulator material may include at least one of glass or a ceramic material. The insulator material may include alumina. The sensor may include a passivation layer directly in contact with the Hall plate. The passivation layer may be at least one of a nitride, an oxide, a polyimide, or benzocyclobutene (BCB). The sensor may be one of a current sensor or a speed sensor.

In a further aspect, a method to manufacture a Hall Effect sensing element includes forming, on a substrate, a plate material having a thickness less than about 100 nanometers and forming an adhesion layer directly in contact with the Hall plate and having a thickness in a range about 0.1 nanometers to 5 nanometers. This aspect may include one or more of the following features. The Hall plate may have a thickness less than 10 nm. The Hall plate may have a carrier concentration of in a range of about $10_{19}$ to about $10^{26}$. The thickness of the Hall plate may be in a range of about 1 nm to 10 nm and the carrier concentration may be about $10^{22}$ to $10^{24}$. Forming the plate material may include forming a plate material comprising a metal nitride. Forming a plate material that includes a metal nitride may include sputtering at least one of tantalum nitride or titanium oxide nitride to form the plate material. Forming the plate material may include forming a plate material that may include a metal oxide. Forming a plate material that includes a metal oxide may include forming a plate material that includes at least a copper oxide or ruthenium oxide. Forming a plate material that includes at least a copper oxide may include sputtering copper in a chamber under vacuum and inserting oxygen into the chamber. Sputtering copper in a chamber under vacuum and inserting oxygen into the chamber may include sputtering copper in a chamber under vacuum while inserting oxygen into the chamber. Sputtering copper in a chamber under vacuum and inserting oxygen into the chamber may include sputtering copper in a chamber under vacuum before inserting oxygen into the chamber. Sputtering copper in a chamber under vacuum and inserting oxygen into the chamber may include sputtering copper in a chamber under vacuum after inserting oxygen into the chamber.

DETAILED DESCRIPTION

Described herein is a Hall plate that significantly improves the sensitivity of a Hall Effect sensing element. In particular, the Hall plate is formed having a plate material that includes a metal, such as a metal oxide or a metal nitride, for example. Further, the Hall plate may be fabricated that has a thickness of about 0.5 nanometers to about 100 nanometers. In some examples, the carrier concentration of the Hall Plate is about $10^{19}$ to about $10^{26}$ carriers/cm$^3$. In one particular example, the thickness of the Hall plate is less than about 10 nm and the carrier concentration is about $10^{22}$ to $10^{24}$. Given that the Hall Voltage, $V_H$, is equal to $-(IB)/(nte)$, where I is the current across the plate length, B is the magnetic field, t is the thickness of the plate, e is the elementary charge, and n is the charge carrier density of the carrier electrons, the Hall element described herein has an increased sensitivity on the order of a ten to a thousand times more sensitive than current Hall elements being used.

Figure 1:
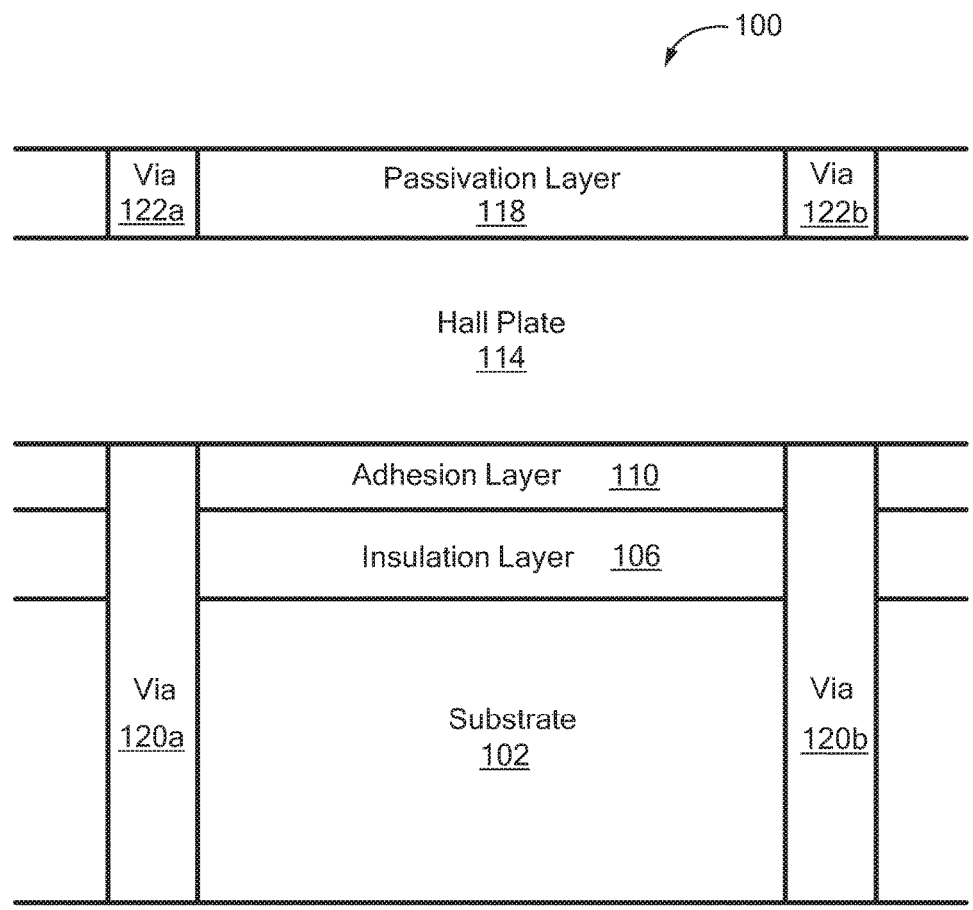
FIG. 1 is a cross-sectional view of a Hall Effect sensing element.

Referring to FIG. 1, one example of a Hall Effect sensing element with a Hall plate that improves sensitivity is a Hall Effect sensing element 100. The Hall effect sensing element 100 is not drawn to scale. The Hall Effect sensing element includes a substrate 102, an insulation layer 106, an adhesion layer 110, a Hall plate 114 and a passivation layer 118. The insulation material 106 is disposed on the substrate material 102 and the adhesion layer 110 is disposed on the insulation layer 106. The adhesion layer 110 enables material used to form the Hall plate 114 to adhere to the insulation layer 106 during a sputtering process, for example. The passivation layer 118 is disposed on the plate material of the Hall plate 114. In this example of a Hall Effect sensing element, the Hall plate 114 may be electrically accessed from the top through vias 122a, 122b or from the bottom through vias 120a, 120b. The vias 120a, 120b are shown as through silicon vias (TSVs), but in other embodiments the vias 120a, 120b may only go through the insulating layer to an underlying integrated circuit feature, such as a metal layer or polysilicon layer.

Figure 2:
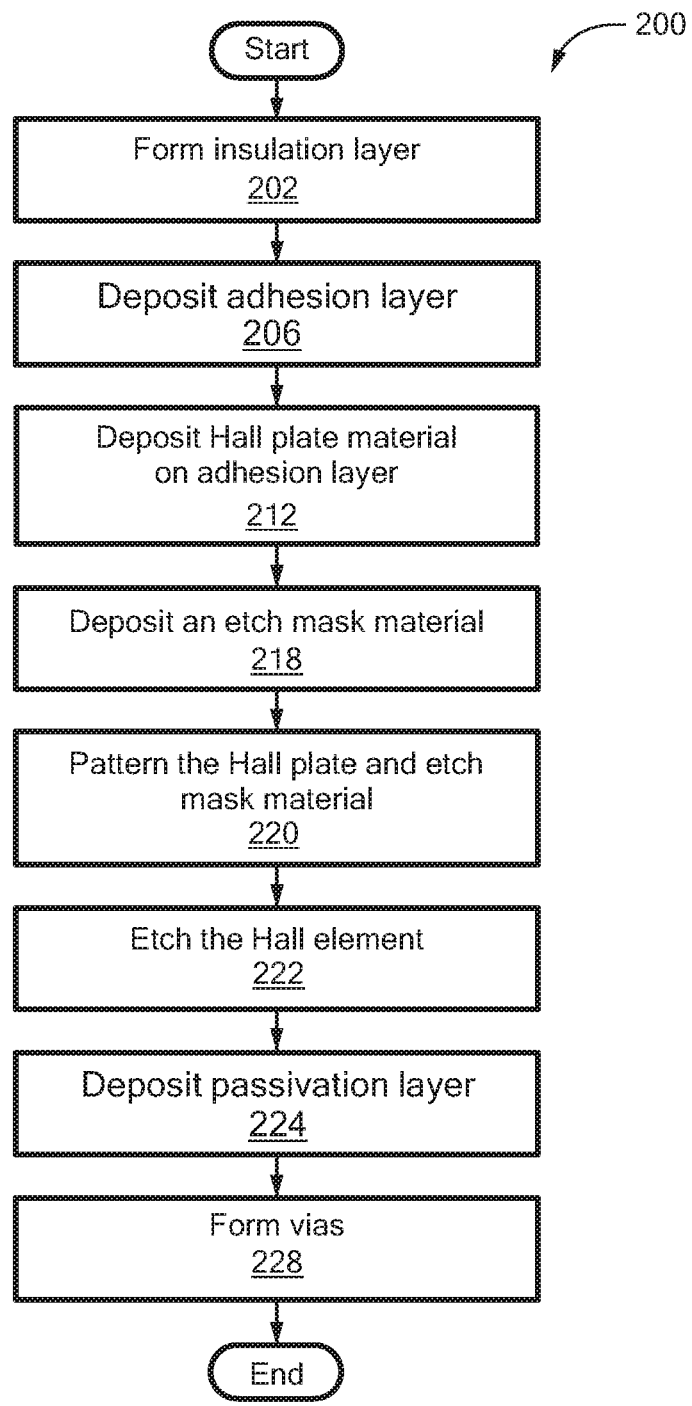
FIG. 2 is a flow diagram of an example to form a Hall plate in the Hall Effect sensing element of FIG. 1.

Referring to FIG. 2, an example of a process to fabricate the Hall Effect sensing element 100 with a Hall plate that improves sensitivity is a process 200. Process 200 forms the insulation layer (202). For example, an oxide, nitride, or a ceramic material, such as, for example, silicon dioxide, silicon nitride, or aluminum nitride (or alumina) is deposited on the substrate 102 to form the insulation layer 106. It would be understood by one of ordinary skill in the art that these materials may not always have the exact stoichiometric quantities. For example, the oxide may not be exactly SiO$_2$, but some other combination of silicon and oxygen. In one example, the substrate 102 is a semiconductor material such as silicon, for example. In another example, the substrate material 102 is an insulator material that includes, for example, at least one of glass, a ceramic material or an alumina. In another embodiment the substrate is an integrated circuit, for example a silicon integrated circuit which may include but is not limited to a CMOS, BiCMOS, or other integrated circuit process. Based on the topology of the underlying substrate some embodiments may include a chemical mechanical polishing (CMP), or other planarization step to the substrate or underlying integrated circuit starting material.

Process 200 deposits an adhesion layer (206). For example, at least one of titanium, tantalum or ruthenium is deposited onto the insulation layer to form the adhesion layer 110. In some examples, the adhesion layer has a thickness from about 0.1 nanometers to about 5 nanometers. It would be apparent to one of ordinary skill in the art that the thickness of the adhesion material would be such that it does not provide a significant current path for the Hall current to travel through such that the Hall element cannot provide sufficient sensitivity of magnetic field response. This sufficient sensitivity will vary depending on the actual application of the Hall elements described herein. In some examples, the adhesion layer 110 may not be continuous or uniform throughout. For example, there may be gaps in the adhesion layer.

Figure 3:
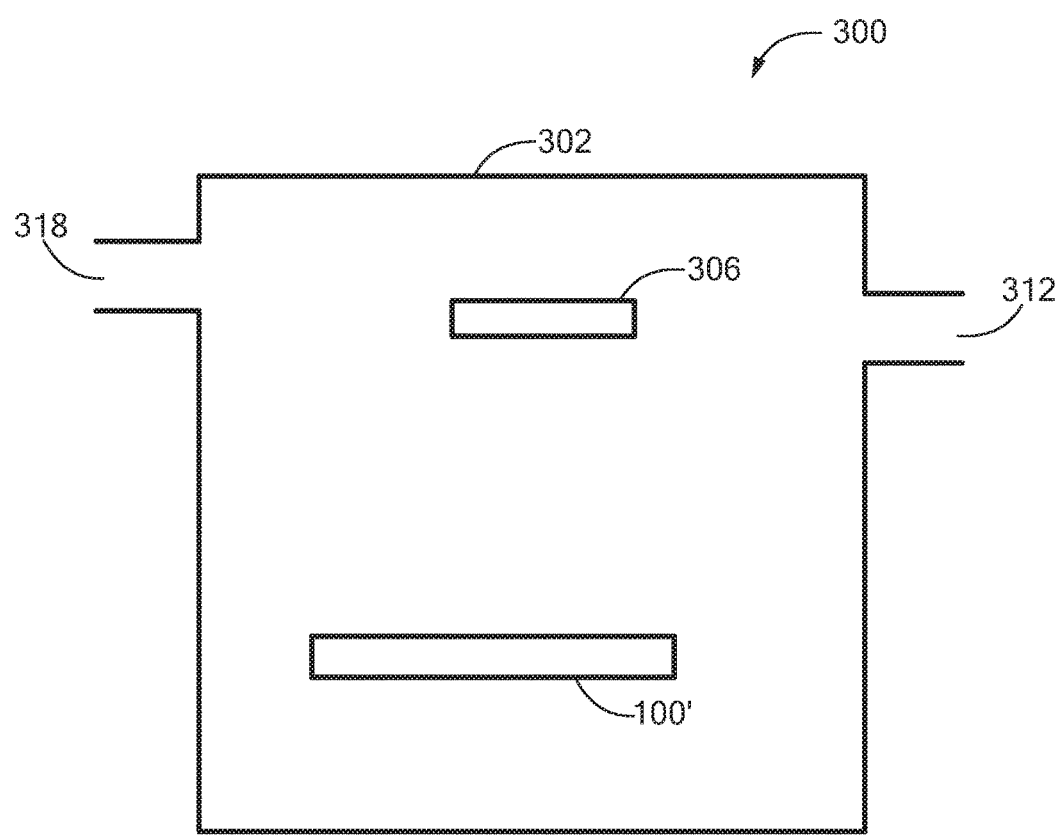
FIG. 3 is a diagram of an apparatus used in a sputtering process to form the Hall plate.

Referring to FIGS. 2 and 3, process 200 deposits a Hall plate material onto the adhesion a layer (212). For example, a Hall plate has a thickness in a range of about 0.5 nanometers to about 100 nanometers and may have a carrier concentration of about $10^{19}$ to about $10^{26}$. In one particular example, the Hall plate has a thickness less than 10 nanometers. In one particular example, the Hall plate has a carrier concentration in a range of about $10^{22}$ to $10^{24}$.

In one example, a metal is sputtered onto the adhesion layer using a sputtering system 300 shown in FIG. 3. In one particular example, a substrate/insulation layer/adhesion layer composite 100' is placed in a chamber 302 with a metal source or target 306 and placed under vacuum by pumping air out through an outlet port 318. In one example, the metal is a copper or ruthenium. In another example, a metal nitride is sputtered onto the adhesion layer using the sputter system 300 such as tantalum nitride or gallium nitride and placed under vacuum by pumping air out through the outlet port 318. As is known in the art, multiple metal or other material targets or source are typically present in a sputtering system. FIG. 3 only shows one target or metal source 306 for simplicity of the figure. In another embodiment, a substrate/insulation layer composite is placed in a sputtering or other suitable deposition chamber 302. In one example, an adhesion layer of Ru of approximately 1 nm in thickness is deposited, followed by a metal such as copper without breaking vacuum between the depositions of the two layers. In other embodiments, other adhesion layer materials, including but not limited to Ru, RuO$_2$, Ti, TiN, Ta, and W, may be used in various combination with different sensing layer materials such as Cu, CdSnO and Ru.

In one particular example, the metal is combined with oxygen to form a ruthenium oxide or a copper oxide such as cuprous oxide, for example. In another particular example, titanium nitride is combined with oxygen to form titanium oxide nitride, for example.

The oxygen is supplied through an inlet port 312. The oxygen may be supplied before, during or after sputtering and the steps may be repeated.

In one particular example, after an adhesion layer has been sputtered in the same machine, copper is sputtered in the chamber 302 under vacuum while oxygen is also being inserted into the chamber 302. In another example, copper is sputtered in the chamber 302 under vacuum before inserting oxygen into the chamber 302. In a further example, copper is sputtered in the chamber 302 after inserting oxygen into the chamber 302.

Process 200 forms an etch mask layer (218). In one example, the etch mask layer is a dielectric that includes, for example, an oxide or a nitride such as a silicon nitride material. In other examples, the etch mask layer may be a polyimide, or benzocyclobutene (BCB), or photoresist material. Process 200 patterns the Hall plate and the etch mask material (220).

The Hall plate is etched (222), for example, in an ion beam etching system, or other etching system. In some cases, any polymer materials are then removed, but in other cases the polymer material could remain, for example if a polyimide or BCB material were used to pattern the Hall plate.

Process 200 deposits a passivation layer (224), which may be, for example, an oxide, nitride, an oxide and nitride layer stack, or a polymer material such as but not limited to a polyimide or BCB.

Process 200 forms vias (228). In one example, in the passivation layer 118 a connection may be made to the top of the Hall plate 114 through vias 122a and 122b. For example, material down to the plate material is removed and filled with tungsten plugs to form the vias 122a, 122b. In other examples, the vias 122a, 122b may be a bond pad material with an adhesion layer, including but not limited to a titanium adhesion layer with aluminum based via material. In one embodiment, the bond pad material is deposited into the vias 122a and 122a without first filling the vias 122a and 122b. In another example, a connection is made from the bottom of the Hall plate 114 using vias 120a, 120b, which may include tungsten plugs. In other examples, the vias 120a, 120b, may be a metal interconnection material with an adhesion layer, including but not limited to a titanium adhesion layer with aluminum based via material. In other example, other standard high conductivity interconnections may be used to connect the Hall plate 114 to the circuit.

Figure 4:
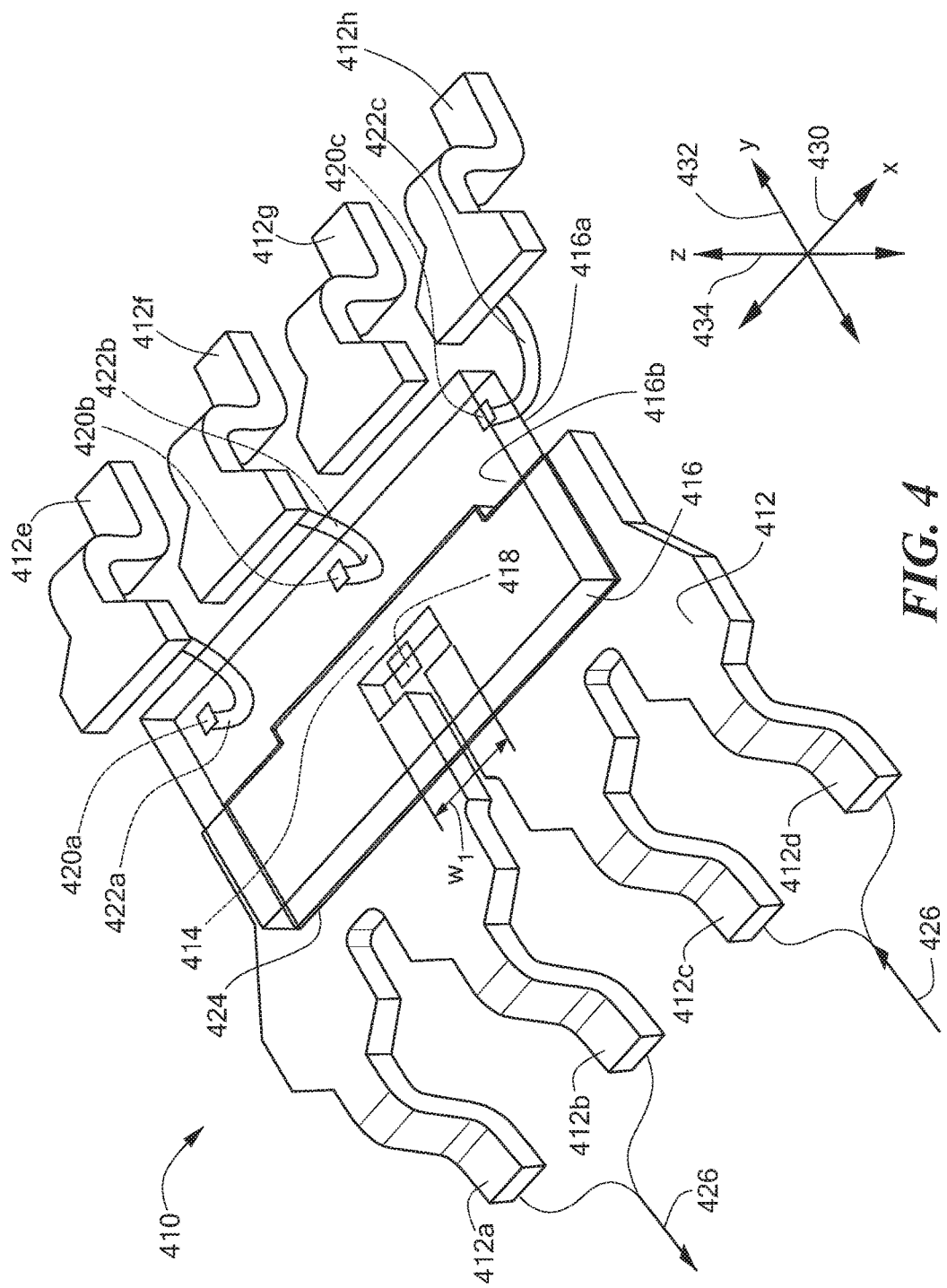
FIG. 4 is an isometric view of a current sensor.

Referring to FIG. 4, an example of a current sensor is a current sensor 410. In FIG. 4, an example of the Hall Effect sensing element 100 is a Hall Effect sensing element 418.

The current sensor 410 includes a lead frame 412 having a plurality of leads 412a-412h. The leads 412a and 412b are coupled to the leads 412c and 412d to form a current path, or current conductor with a narrow portion 414 having a width w1. The current sensor 410 also includes a substrate 416 having a first surface 416a and a second, opposing surface 416b. The Hall Effect sensing element 418, in some examples, may be diffused into the first surface 416a, or otherwise disposed on the first surface 416a. The substrate 416 can be comprised of a semiconductor material, e.g., silicon, or, in an alternate embodiment, the substrate 416 can be comprised of an insulating material.

The substrate 416 is disposed above the lead frame 412 so that the first surface 416a is proximate to the current conductor portion 414 and the second surface 416b is distal from the current conductor portion 414 and more specifically, so that the Hall Effect sensing element 418 is in close proximity to the current conductor portion 414. In the illustrated embodiment, the substrate 416 has an orientation that is upside down (i.e., the first surface 416a is directed downward) relative to a conventional orientation with which a substrate is mounted in an integrated circuit package.

The substrate 416 has bonding pads 420a-420c on the first surface 416a, to which bond wires 422a-422c are coupled. The bond wires are further coupled to the leads 412e, 412f, 412h of the lead frame 412.

An insulator 424 separates the substrate 16 from the lead frame 412. The insulator 424 can be provided in a variety of ways. For example, in one embodiment, a first portion of the insulator 424 includes a four μm thick layer of a BCB resin material deposited directly on the first surface 416a of the substrate 416. A second portion of the insulator 424 may include a layer of underfill material, for example Staychip™ NUF-2071 E (Cookson Electronics Equipment, New Jersey), deposited on the lead frame 412. Such an arrangement provides more than one thousand volts of isolation between the substrate 416 and the lead frame 412.

It will be understood that the current conductor portion 414 is but a part of the total path through which an electrical current flows. For example, a current having a direction depicted by arrows 426 flows into the leads 412c, 412d, which are here shown to be electrically coupled in parallel, through the current conductor portion 414, and out of the leads 412a, 412b, which are also shown here to be electrically coupled in parallel.

With this arrangement, the Hall effect sensing element 418 is disposed in close proximity to the current conductor portion 414 and at a predetermined position relative to the conductor portion 414, such that a magnetic field generated by an electrical current passing though the current conductor portion 414, in a direction shown by arrows 426, is in a direction substantially aligned with a maximum response axis of the Hall Effect sensing element 418. The Hall Effect sensing element 418 generates a voltage output proportional to the magnetic field and therefore proportional to the current flowing through the current conductor portion 414. The illustrated Hall Effect sensing element 418 has a maximum response axis substantially aligned with a z-axis 434. Because the magnetic field generated in response to the current is circular about the current conductor portion 414, the Hall effect sensing element 418 is disposed just to the side (i.e., slightly offset along a y-axis 432) of the current conductor portion 414, as shown, where the magnetic field is pointed substantially along the z-axis 434. This position results in a greater voltage output from the Hall Effect sensing element 418, and therefore improved sensitivity. However, a Hall effect sensing element, or another type of magnetic field sensor, for example a magnetoresistance element, having maximum response axis aligned in another direction, can be disposed at another position relative to the current conductor portion 414, for example, on top of the current conductor portion 414 (in a direction along z-axis 434).

While one Hall Effect sensing element 418 is shown on the first surface 416a of the substrate 416, it will be appreciated that more than one Hall Effect sensing element can be used. Also, additional circuitry, for example an amplifier, can also be diffused in or otherwise disposed on, or supported by the first and/or second surfaces 416a, 416b of the substrate 416.

In the embodiment of FIG. 4, the close proximity between the Hall Effect sensing element 418 and the current conductor 414 is achieved by providing the Hall Effect sensing element 418 on the first substrate surface 416a, which is positioned closer to the current conductor portion 414 than the second surface. In other embodiments, this advantageous close proximity is achieved by providing the Hall effect sensing element 418 on the second substrate surface 416b and forming the current conductor portion 414 so as to be in substantial alignment with the second surface 416b.

In other examples, current sensor 410 could also be flip chip assembled with solder balls, bumps, or stud bumps of copper. For instance, although wire bonds are shown as the connection method in FIG. 4, it would be possible to provide a connection between the die and leadframe using a flip chip process. For example, the active areas of the die 416 with solder balls or stud bumps (for example copper pillars with solder) between lead fingers (not shown) and the bond pads or connection points on the die 416. The connection of the die to the leadframe is typically achieved via a reflow step. In an alternative embodiment, a conductive epoxy adhesive is used at designated locations to connect the leadframe to the die. Alternatively, a lead on chip process could also be used. This process is one where the leadframe is over the die and then electrical connection may be made from the top surface of the leadframe to the top surface of the die where these two surfaces are facing the same direction.

The width w1 (FIG. 4) is selected in accordance with a variety of factors, including, but not limited to a desired sensitivity of the current sensor 410 (FIG. 4), and a desired reduction of performance variation resulting from manufacturing variation in relative position of the current path 414 and the Hall effect sensing element 418. In general, it will be appreciated that selecting the width w1 to be comparable to a width of the Hall Effect sensing element 418, provides the greatest sensitivity of the current sensor 410. However, it will also be appreciated that selecting the width w1 to be greater than the width of the Hall Effect sensing element 418 provides the smallest performance variation resulting from manufacturing tolerance of Hall element positional placement in the x-direction 430.

Figure 5:
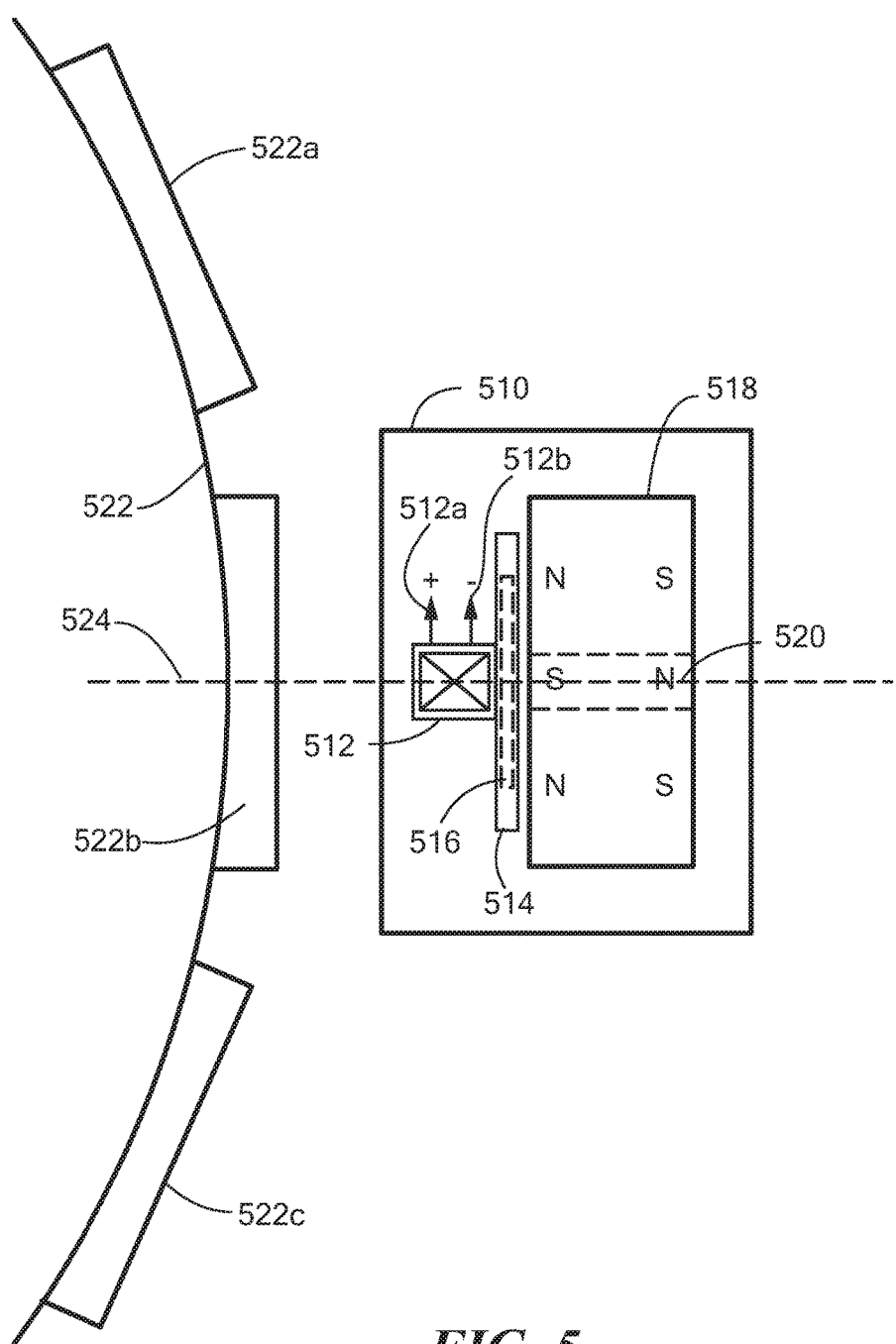
FIG. 5 is a block diagram of a prior art magnetic field sensor having a magnetic field sensing element, an electronic circuit, and a magnet.

Referring to FIG. 5, an example of a speed sensor is a magnetic field sensor 510. In FIG. 5, an example of the Hall Effect sensing element 100 is a Hall Effect sensing element 512. In other embodiments, multiple Hall Effect sensing elements may be used to determine either one or both of direction and vibration in addition to speed.

In one example, the magnetic field sensor 510 is responsive to a gear 522 having ferromagnetic gear teeth, e.g., gear teeth 522a, 522b, 522c. It should be recognized that the gear 522 is but one type of "ferromagnetic target object," or simply "target object," which the magnetic field sensor 510 can be responsive. In other magnetic systems, the ferromagnetic target object may include a permanent magnet (or a hard ferromagnetic material), for example, the above-described ring magnet having alternating north and south poles.

The magnetic field sensor 510 includes a magnetic field sensing element 512 coupled to an electronic circuit 516. The magnetic field sensing element 512 and the electronic circuit 516 can be disposed upon (i.e., integrated within or upon) a substrate 514. For clarity, here the Hall Effect sensing element 512 is shown with an exaggerated size, and rotated out of the plane of the substrate 514. Furthermore, for clarity, the Hall Effect sensing element 512 is shown to be on top of the substrate 514, but it will be appreciated that Hall Effect sensing elements are usually disposed upon or within a surface of a substrate of an integrated circuit. In other embodiments, the Hall Effect sensing element(s) could be located on the opposite surface of the die from the circuitry by the use of through silicon vias (TSVs).

The magnetic field sensor 510 can also include a magnet 518 (e.g. a permanent magnet or hard ferromagnetic material). The magnet 518 is configured to generate a magnetic field, which is generally directed along an axis 524 at the position of the Hall Effect sensing element 512, and which is subject to direction and amplitude changes depending upon positions of the gear teeth 522a, 522b, 522c relative to the magnetic field sensor 510. However, the structure of the magnetic field at faces of the magnet 518 can be more complex due to a core 520. In other embodiments, the magnetic field may be produced by a magnetic element without a core. In other embodiments, the magnetization or direction of magnetic field from the magnet may be different than generally parallel to the axis 524, for example perpendicular to the axis 524, or at any other angle.

The electronic circuit 516 is configured to generate an output signal (not shown). The output signal, when the gear is not moving, is indicative of whether the magnetic field sensor 510 is over a gear tooth or a gear valley. Thus, the magnetic field sensor 510 is sometimes referred to as a "tooth detector" (or feature detector) as opposed to an "edge detector." The output signal, when the gear is rotating, has an edge rate or a frequency indicative of a speed of rotation of the gear. Edges or transitions of states of the output signal can be used to identify positions of edges of the gear teeth as they pass by the magnetic field sensor. In other embodiments, the sensor may not be able to detect the presence or absence of a tooth, but rather only be used for detection of speed or a change in position of a target.

The magnet 518 can include the central core 520 comprised of a soft ferromagnetic material disposed within the magnet 518. An example of a magnet with a core is described in U.S. Pat. No. 6,278,269, entitled "Magnet Structure," issued Aug. 21, 2001, which patent is assigned to the assignee of the present invention and incorporated herein by reference in its entirety. As described in U.S. Pat. No. 6,278,269, the pole configuration provided by the magnet 518 with the core 520 lowers the base field (or baseline) of a flux density of the magnetic field at some points above the surface of the core 520 (e.g., to the left of the core as shown) when a valley of the gear 522 is proximate to the magnetic field sensor 510. A predetermined baseline (e.g., within a range of about +/six hundred Gauss) at the Hall effect sensing element 512, and a resulting differential magnetic field signal 512a, 512b (i.e., an analog differential proximity signal) near zero, can be achieved with proper design. In other embodiments, the magnet may not have a central soft ferromagnetic core, but rather an air core. Other embodiments may be found in U.S. Patent Publication Number 2014-0320124, entitled "INTEGRATED CIRCUIT PACKAGE HAVING A SPLIT LEAD FRAME AND A MAGNET," published Oct. 30, 2014 and U.S. Patent Publication Number 2013-0249546, entitled "INTEGRATED CIRCUIT PACKAGE HAVING A SPLIT LEAD FRAME," published Sep. 26, 2013, which are incorporated herein in their entirety and assigned to the same assignee as the present application.

In contrast, when a gear tooth of the gear 522 is proximate to the Hall Effect sensing element 512, the Hall element 512 experiences a higher magnetic field and generates the differential magnetic field signal 512a, 512b with a higher value. As described above, a difference between the baseline magnetic field and the higher magnetic field is related to ultimate accuracy of the magnetic field sensor 510.

The baseline magnetic field, which can occur when the magnetic field sensor 510 is proximate to a valley in the gear 522, remains relatively low, with little change, even as the air gap between the gear 522 and the magnetic field sensor 510 varies. This advantageous result of low baseline substantially independent of air gap is achieved by operation and design of the core 520 (including an air core), which results in opposite magnetic poles being presented at the face of the core 520 (i.e., left side as shown) proximate to the magnetic field sensing element 512, particularly when the Hall effect sensing element 512 is proximate to a valley in the gear 522. This effect is also described in U.S. Pat. No. 5,781,005, issued Jul. 14, 1998, entitled "Hall-Effect Ferromagnetic-Article-Proximity Sensor," which patent is assigned to the assignee of the present invention and incorporated herein by reference in its entirety.

The above-described low baseline, which occurs when the magnetic field sensor is proximate to a gear valley, results in an enhanced ability of the electronic circuit 516 to differentiate the presence of the gear tooth from a gear valley.

The above-described low baseline also provides an ability to more easily compensate for temperature effects, since the baseline magnetic field is relatively small, and therefore, circuit variations that occur due to temperature can have less influence when the magnetic field sensor 510 is proximate to a valley in the gear 522. Essentially, any error in the circuitry is able to be well corrected near the baseline magnetic field level or range, since any multiplication of the error (near zero) is smaller. Therefore, a magnetic field threshold used to distinguish a tooth from a valley can be made smaller while maintaining precision because there is less noise or error in the system over its operating conditions such as temperature, or humidity.

Figure 6:
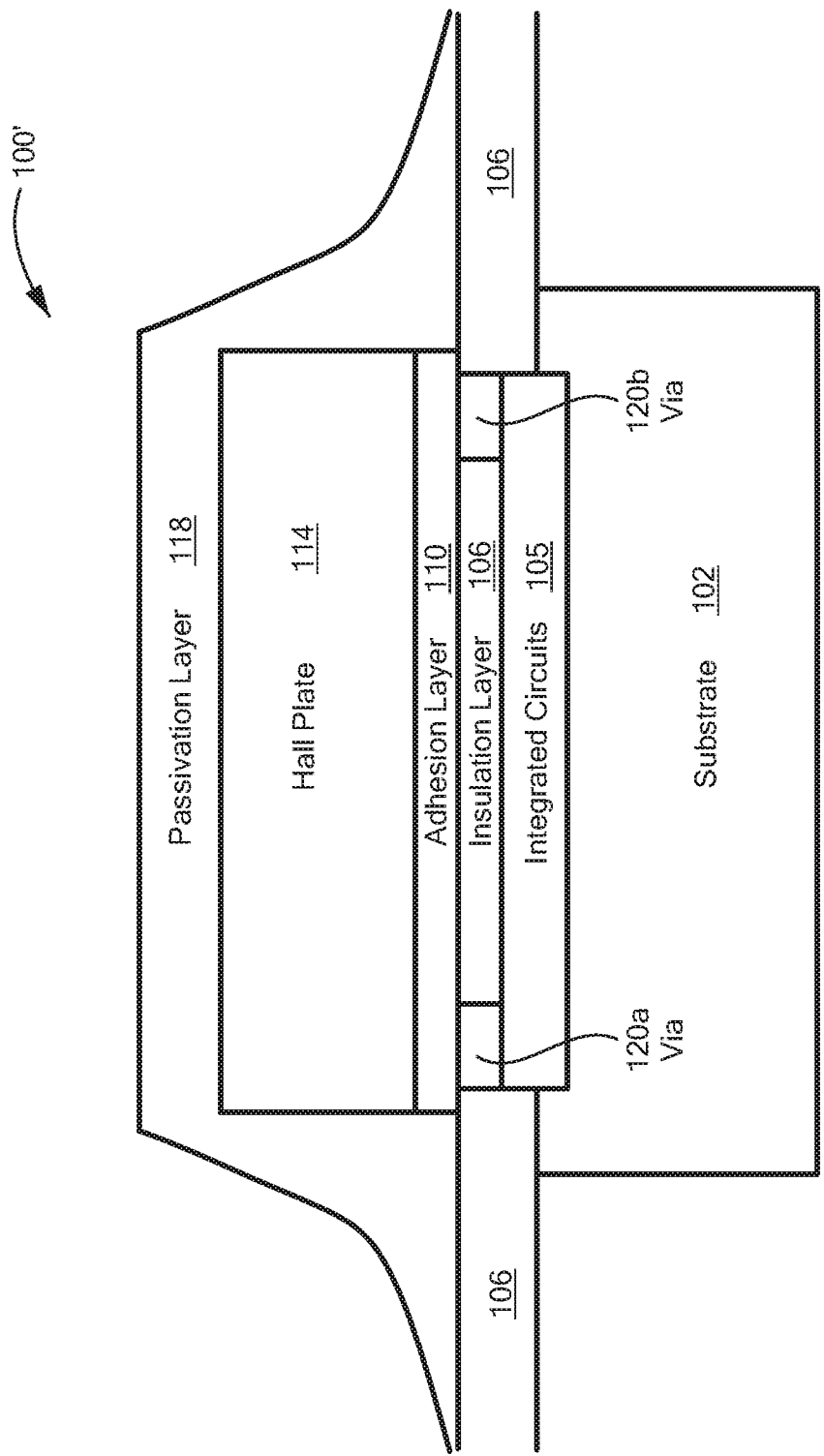
FIG. 6 is a cross-sectional view of another example of a Hall Effect sensing element Like reference symbols in the various drawings indicate like elements.

Referring to FIG. 6, another example of a Hall Effect sensing element with a Hall plate that improves sensitivity is a Hall Effect sensing element 100'. The Hall effect sensing element 100' is not drawn to scale. In FIG. 6, integrated circuits 105 are depicted in the substrate 102 and the integrated circuits are coupled to the Hall plate 114 through vias 120a, 120b.

The processes described herein are not limited to the specific examples described. For example, the process 200 is not limited to the specific processing order of FIG. 2. Rather, any of the processing blocks of FIG. 2 may be re-ordered, combined or removed, performed in parallel or in serial, as necessary, to achieve the results set forth above.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A Hall Effect sensing element comprising:
a Hall plate having a thickness less than about 100 nanometers, wherein the Hall plate is a copper oxide; and
an adhesion layer directly in contact with the Hall plate and having a thickness in a range about 0.1 nanometers to 5 nanometers.

2. The Hall Effect sensing element of claim 1, wherein the thickness of the Hall plate is less than about 10 nm.

3. The Hall Effect sensing element of claim 1, wherein the Hall plate has a carrier concentration in a range of about $10^{19}$ to about $10^{26}$ carriers per cubic centimeter.

4. The Hall Effect sensing element of claim 3, wherein the Hall plate has a carrier concentration is in a range of about $10^{22}$ to $10^{24}$ carriers per cubic centimeter.

5. The Hall Effect sensing element of claim 1, wherein the copper oxide is cuprous oxide.

6. The Hall Effect sensing element of claim 1, wherein the adhesion layer is one of ruthenium or ruthenium oxide.

7. The Hall Effect sensing element of claim 1, further comprising a substrate comprising one of a semiconductor material or an insulator material,
wherein the adhesion layer is disposed between the plate material and the substrate material.

8. The Hall Effect sensing element of claim 7, further comprising an integrated circuit on the semiconductor substrate material.

9. The Hall Effect sensing element of claim 8, further comprising vias connecting the Hall effect sensing element to the integrated circuit from the bottom or substrate side of the Hall effect sensing element.

10. The Hall Effect sensing element of claim 8, further comprising vias connecting the Hall effect sensing element to the integrated circuit from the top or furthest side of the Hall effect sensing element away from the substrate or integrated circuit.

11. The Hall Effect sensing element of claim 7, wherein the semiconductor material comprises silicon.

12. The Hall Effect sensing element of claim 7, wherein the insulator material comprises at least one of glass or a ceramic material.

13. The Hall Effect sensing element of claim 7, wherein the insulator material comprises alumina.

14. The Hall Effect sensing element of claim 7, wherein the insulator material comprises an oxide or nitride.

15. The Hall Effect sensing element of claim 1, further comprising a passivation layer directly in contact with the Hall plate.

16. The Hall Effect sensing element of claim 15, wherein the passivation layer is at least one of a nitride, an oxide, a polymer, a polyimide, or benzocyclobutene (BCB).

17. A sensor comprising:
a Hall Effect sensing element comprising:
a substrate comprising one of a semiconductor material or an insulator material;
an insulation layer in direct contact with the substrate;
an adhesion layer having a thickness in a range of about 0.1 nanometers to 5 nanometers and in direct contact with the insulation layer, the adhesion layer is one of ruthenium or ruthenium oxide; and
a Hall plate in direct contact with the adhesion layer and having a thickness less than about 100 nanometers, the Hall plate is a copper oxide.

18. The sensor of claim 17, wherein the thickness of the Hall plate is less than about 10 nm.

19. The sensor of claim 17, wherein the Hall plate has a carrier concentration is in a range of about $10^{22}$ to $10^{24}$ carriers per cubic centimeter.

20. The sensor of claim 17, wherein the semiconductor material comprises silicon.

21. The sensor of claim 17, wherein the insulator material comprises at least one of glass or a ceramic material.

22. The sensor of claim 21, wherein the insulator material comprises alumina.

23. The sensor of claim 17, further comprising a passivation layer directly in contact with the Hall plate.

24. The sensor of claim 23, wherein the passivation layer is at least one of a nitride, an oxide, a polyimide, or benzocyclobutene (BCB).

25. The sensor of claim 17, wherein the sensor is one of a current sensor or a speed sensor.

26. A method to manufacture a Hall Effect sensing element, comprising:
forming, on a substrate, a plate material having a thickness less than about 100 nanometers, the plate material is a copper oxide; and
forming an adhesion layer directly in contact with the Hall plate and having a thickness in a range about 0.1 nanometers to 5 nanometers, the adhesion layer is one of ruthenium or ruthenium oxide.

27. The method of claim 26, wherein the Hall plate has a thickness less than 10 nm.

28. The method of claim 26, wherein the Hall plate has a carrier concentration of in a range of about $10^{19}$ to about $10^{26}$ carriers per cubic centimeter.

29. The method of claim 28, wherein the thickness of the Hall plate is in a range of about 1 nm to 10 nm and the carrier concentration is about $10^{22}$ to $10^{24}$ carriers per cubic centimeter.

30. The method of claim 26, further comprising forming a plate material comprising:
sputtering copper in a chamber under vacuum; and
inserting oxygen into the chamber.

31. The method of claim 30, wherein sputtering copper in a chamber under vacuum and inserting oxygen into the chamber comprises sputtering copper in a chamber under vacuum while inserting oxygen into the chamber.

32. The method of claim 30, wherein sputtering copper in a chamber under vacuum and inserting oxygen into the chamber comprises sputtering copper in a chamber under vacuum before inserting oxygen into the chamber.

33. The method of claim 30, wherein sputtering copper in a chamber under vacuum and inserting oxygen into the chamber comprises sputtering copper in a chamber under vacuum after inserting oxygen into the chamber.

\* \* \* \* \*

UNITED STATES PATENT AND TRADEMARK OFFICE
CERTIFICATE OF CORRECTION

PATENT NO. : 9,857,437 B2
APPLICATION NO. : 15/088493
DATED : January 2, 2018
INVENTOR(S) : William P. Taylor et al.

Page 1 of 1

It is certified that error appears in the above-identified patent and that said Letters Patent is hereby corrected as shown below:

Column 1, Line 28 delete "concentration is in" and replace with --concentration in--.

Column 2, Line 2 delete "concentration is in" and replace with --concentration in--.

Column 2, Line 20 delete "range about" and replace with --range of about--.

Column 2, Line 24 delete "$10_{19}$" and replace with --$10^{19}$--.

Column 5, Line 14 delete "122a and 122a" and replace with --122a and 122b--.

Column 5, Line 21 delete "example," and replace with --examples,--.

Column 5, Line 52 delete "substrate 16" and replace with --substrate 416--.

Signed and Sealed this
Twenty-sixth Day of June, 2018

Andrei Iancu
*Director of the United States Patent and Trademark Office*